United States Patent [19]

Inoue

[11] 3,741,426

[45] June 26, 1973

[54] SPARK-DISCHARGE SURFACE TREATMENT OF A CONDUCTIVE WORKPIECE

[75] Inventor: Kiyoshi Inoue, Tokyo, Japan

[73] Assignee: IJR (Inoue-Japox Research Inc.), Yokohama, Japan

[22] Filed: July 28, 1971

[21] Appl. No.: 166,685

[52] U.S. Cl. .................................................. 219/76
[51] Int. Cl. .................................................. B23k 9/04
[58] Field of Search .............. 219/69 C, 69 D, 69 S, 219/76, 77

[56] References Cited

UNITED STATES PATENTS 3,098,150 7/1963 Inoue .............................. 219/76 X
3,524,956 8/1970 Rocklin .............................. 219/76
3,246,113 4/1966 Scarpelli .............................. 219/69 C

*Primary Examiner*—R. F. Staubly
*Attorney*—Karl F. Ross

[57] ABSTRACT

Method of and apparatus for the surface treatment of a workpiece or substrate, e.g., to fuse material thereto, wherein an electrode is brought into iterative contact with the workpiece to form an interface and an electrical pulse is applied across the interface. A circuit network responsive to the interface impedance controls an electronic switch to deliver the pulses when the impedance is in the proper range of impedance values.

21 Claims, 5 Drawing Figures

SPARK-DISCHARGE SURFACE TREATMENT OF A CONDUCTIVE WORKPIECE

FIELD OF THE INVENTION

The present invention relates to the surface-treatment of electrically conductive bodies and, more particularly, to an improved method of and apparatus for providing a metallic surface with a hardened layer and coating such a surface with a deposit of a metal or alloy different from the substrate with the aid of repeated spark discharge between the surface and an electrode urged together.

BACKGROUND OF THE INVENTION

In spark-discharge surface-treatment technique, a spark discharge is employed which is effected when an electrode is brought into and/or out of contact with a metallic surface to be treated, with a brief electrical impulse applied between them which is of an intensity sufficient to effect localized heating of the relatively small discharge-impinging area, and by sweeping such contact discharge over a selected surface region of the workpiece a metallurgical modification or hardening of this selected surface area is obtained. Using these principles, the coating of a metallic workpiece with a metal or alloy different from the substrate, for example, carbide coating, can be achieved with a firm metallurgical bond between the workpiece surface and the coated layer. As shown in Japanese Pat. specification No. 32–9998 issued Nov. 29, 1957, for example, a precoat layer of coating material may be applied to a workpiece surface to be treated and an electrode, preferably in the form of a rotary member, may be moved or rolled over the precoat while urging it against the surface while an electric impulse is repeatedly applied between the electrode and the workpiece to fuse the precoat to the receiving workpiece surface at successive locations. Even without such a precoat, however, the electrode may itself form a source of the coating material, and improved systems and practical applications using the fusion transfer of a material to a workpiece surface from the electrode in a rotary disk or other form in sliding or tangential movement over the surface with the aid of repeated contact discharges may result as shown, for example, in Japanese Pat. specifications, No. 32–599 issued Jan. 29, 1959, No. 32–2446 issued Apr. 19, 1959, No. 32–2900 issued May 16, 1959 and No. 32–6848 issued Aug. 28, 1959. In these methods, the material fusion-transfer contact discharge can be repetitively effected by a capacitor circuit designed to charge and instantaneously discharge across the points of contact between the electrode and the workpiece and recharge as the contact region shifts from one contact to the next on points between the electrode and the workpiece. Otherwise, a mechanical or electrical switching of a continuous voltage source was employed to provide periodically a pulsed voltage across the moving interface of the electrode and the workpiece.

In a method shown in U.S. Pat. No. 3,098,150 issued July 16, 1963, an electrode tip is repeatedly driven into contact with a workpiece, for example, under a spring force applied to the electrode held resiliently upon an electrode holder and a spark discharge is drawn between the tip and the workpiece from a charged capacitor, thereby creating a partial weld between them. Coupled with the electrode holder, there is an electromagnetic coil which is designed to be energized at least in part by the charging current of the capacitor or a short-circuit condition between the electrode and the workpiece and, thus is operable, upon contact of the electrode tip with the workpiece or termination of the capacitor discharge, to draw the electrode tip abruptly away from the workpiece in order to break the weld and leave material from the electrode tip deposited upon the workpiece. Of course, the coating material may be disposed between the electrode and the workpiece, here again, independently of the electrode material. Thus, according to this method, each metal fusion and deposit cycle is sharply controlled by the electrode vibration with each stroke cycle advantageously synchronized with capacitor discharge and recharge, thus permitting more consistent and uniform deposition than with other prior systems in which contact discharges and produced only randomly over the contact region of the electrode and the workpiece in a continuous displacement of intermittent displacement. A significant disadvantage of this method is, however, that a capacitor is used which requires a relatively long period to store the necessary energy to be instantaneously delivered at the treatment interface as a high-power spark impulse of sufficient intensity and, consequently, there is a severe restriction in the frequency of discharge impulses and, hence, in the rate of deposition attainable. Another restriction in this method in which the vibration is synchronized with the capacitor charge and recharge cycle is, as is manifest, in the flexibility of changing treatment parameters which are desirably chosen over a wide range depending upon the particular combination of electrode and workpiece materials.

In summary, it may be said in practical terms that prior-art spark deposition or treatment methods are more or less unsatisfactory not only in flexibility in parameter selection but also, significantly, in the maximum rate of deposition or treatment attainable, the consistency of deposition, the stability of operation and the uniformity of the deposited surface, the unsatisfaction with these latter being even more remarkable when an attempt is made to improve the parameter flexibility of the system such as by using a pulse switching generator of an adjustable but constant output frequency at the sacrifice of synchronization.

OBJECTS OF THE INVENTION

It is, therefore, a principal object of the present invention to provide an improved method of spark-discharge treating a metallic surface whereby a highly uniform hardened or deposit-coating of an excellent quality of another metal or alloy is provided on the workpiece surface at a high speed.

It is another object of the present invention to provide an apparatus for carrying out such an improved method, which is stable in operation and thus insures a higher treatment speed, is consistent in operation for a desired result and is designed to select operation parameters depending upon the particular electrode and workpiece materials.

It is a further object of the present invention to provide an improved spark-discharge deposition system with an operator's hand-holdable electrode device, which makes it possible for the operator to optimize one or more of mechanical parameters automatically upon deviation of such parameters from an optimal range in the course of the operation of the device.

SUMMARY OF THE INVENTION

It has been found that the afore-mentioned shortcomings of prior-art spark-treatment methods and apparatus arise from the fact that the mode of impressing a pulse across the spark treatment or deposition interface was not adaptive or optimized with the state of the interface which tends to fluctuate because of an unavoidable variation in mechanical parameters, especially in the contact pressure applied between the electrode and the workpiece bringing them together of withdrawing them from each other against a variable counterpressure. The fluctuation or variation of the contact pressure from a preselected range or value is unavoidable insofar as the electrode, whether vibratory or rotary, may be conveniently handled by an operator to sweep over a required surface area for treatment as is conventional, but it has been found that even where considerable care is taken by the operator to maintain the contact pressure in conjunction with other mechanical parameters or even where the electrode device is operated on a continuous automatic basis, even a slight variation in these parameters largely changes the material deposition or treatment performance by a series of impulses. As a result, the quantity of material deposited was generally random and variable from one spark impulse to another, resulting in only a limited uniformity of the deposited or treated layer on the workpiece surface. In addition, such variation renders unstable, almost in all of the prior apparatus, the operation of its entire electrical and mechanical system.

According to the present invention there is provided a spark-deposition or treatment power supply circuit which incorporates an electronic power switch between a power supply and an interfacial gap to impress a series of sharply defined intermittent power pulses controlled each or in series by an information signal derived from the interface. The interface is, of course, here constituted by a workpiece surface to be treated and an electrode juxtaposed therewith preferably in the presence of a fusion-depositable material such as a carbide, in the interfacial region. The workpiece and the electrode are, as usually, brought together to form a localized contact between them across which an impulsive spark or contact discharge may occur, the localized contact discharge being broken to leave a hardened area or a deposit of material fused to the contacted area of the workpiece surface as the latter and the electrode are relatively displaced to establish the next contact discharge with which such a localized hardening or fusion deposit may again occur.

More specifically, the gap or discharge-interface information signal is derived from the interface in the from of a signal which is representative of gap or discharge-interface impedance after a preceding power pulse and a threshold is employed which is representative of a preselected prepulse interface gap state. The threshold is established in a control pulse generator, which is used to turn on and off the electronic power switch mentioned above, such that when and only when a gap or discharge-interface information value is ascertained to attain the threshold value does a control pulse develop at the output of the control pulser to trigger the power switch and provide the next power pulse across the interface. Thus, the threshold triggering of power pulses according to the present invention not only eliminates premature firing or triggering of a power pulse at a discharge interface which has been rendered inadequate for successful deposition due, for example, to an excess contact pressure, but also effectively compensate for variation in mechanical parameters such as the contact pressure so that a substantially uniform heating or deposition performance is attained from one discrete power discharge to another to leave a substantially identical amount of deposit fused to the discharge area of the workpiece in each of the successive discharge cycles, thus insuring a highly uniform deposition-coated surface of the workpiece.

When the electrode vibration type spark deposition treatment is employed, an apparatus according to the present invention also includes a vibrator which may be of an electromagnetic type as conventional but whose energizing network is in the present invention an independent oscillator whose frequency is adjustable as desired, in contrast to the prior electrode-vibration type system mentioned earlier. In addition, each of a series of discharge power pulses applied to the treatment or deposition interface is closely synchronized with each stroke of such electrode vibration in a usual range of operation and triggered only after the complete quenching of contact discharge from the preceding power pulse is ascertained and upon the gap state attaining a preselected impedance threshold as mentioned previously so that for unavoidable variation in the length of the electrode vibration stroke or contact pressure, there is no practical variation in material deposition or surface hardening performance from one triggered discrete discharge to another. The electrode-vibrator unit may conveniently be a hand-holdable device as is conventional. For this particular embodiment, the present invention also provides in the electrode-vibration oscillator, means responsive to substantial departure of the operator's given contact pressure to urge the vibrating electrode against the workpiece surface, from a desired range to automatically interrupt the electrode vibration thereby permitting the operator to correct such deviation and improving the working efficiency of the system.

DESCRIPTION OF THE DRAWING

The above and other objects, features and advantages of the present invention will become more readily apparent from the following description, reference being made to the accompanying drawing in which.

DETAILED DESCRIPTION OF THE EMBODIMENTS

In the description which follows, the explanation of several embodiments of the present invention will proceed in connection with spark-discharge treatment of the type in which the material of an electrode which may be brought into contact with a workpiece surface either intermittently by vibration or continuously by tangential displacement such as by rotation, the electrode material is fusion-transferred to the workpiece surface as the contact is broken to form a deposit of the electrode material upon the workpiece surface. It is to be understood, however, that these embodiments are also applicable to the spark-discharge treatment of the type in which a depositable material is disposed in the region of the contact independently of the electrode material and is fusion-deposited on the workpiece surface with the aid of a localized spark discharge between the electrode and the workpiece surface where the localized contact is made and broken. Moreover, it is to be understood that the illustrated system is applicable to spark discharge hardening in which no material deposition occurs and the workpiece is treated with a hardened layer created with the aid of a repeated contact discharge as defined above.

Figure 1:
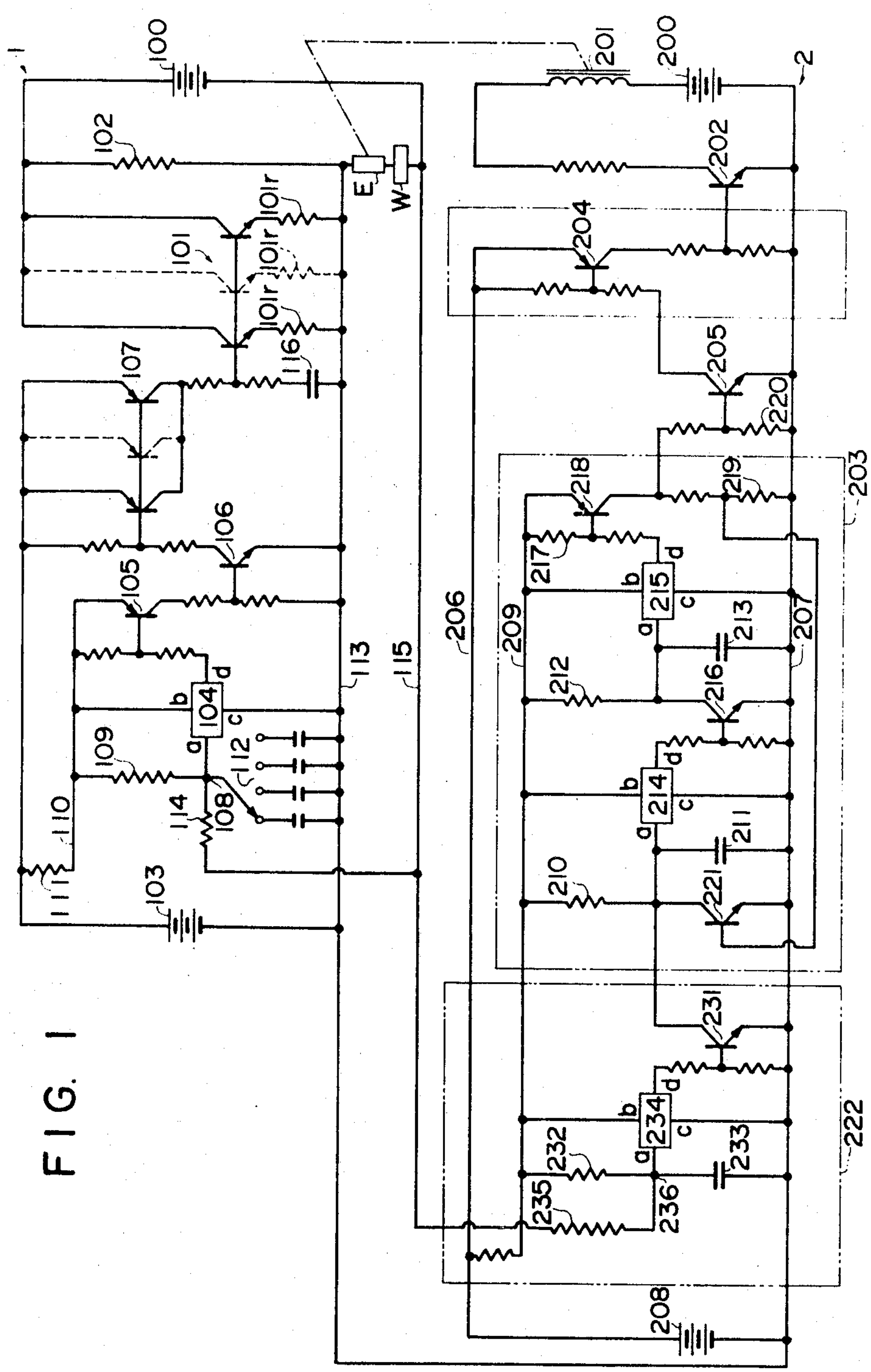
FIG. 1 is a circuit diagram showing a power supply system embodying the principles of the present invention and the oscillator network the latter being optimal but advantageously used for vibrating the electrode where the electrode vibration type spark deposition or treatment is to be practiced.

Referring now to FIG. 1 there is shown a system for a sparkdischarge deposition apparatus for coating a workpiece W forming an interfacial gap with an electrode E juxtaposed therewith, usually in a gaseous medium, by a series of pulsed material fusion and transfer contact discharges controlledly created between them by a power pulse generator 1 in accordance with the present invention. The electrode is here shown constituted as a discharge-fusible electrode tip which is resiliently supported upon an electrode holder (not shown) and, by means of an electromagnetic coil coupled therewith and energized by an oscillator circuit 2, is vibrated into an intermittent contact with workpiece W with a resulting intermittent impact force tending to urge electrode E and workpiece W together against a resilient force tending to draw them away from each other or with a resulting intermittent retraction force tending to draw them from each other against a resilient force tending to urge them together. Alternatively, electrode E may, of course, be any of the other operative forms as noted earlier and may be a rotary member adapted for rolling or sliding-contact movement over workpiece W, preferably with a resilient force tending to remove them from each other against a force tending to urge them together, in which case the vibrator circuit 2 is replaced by a suitable rotary mechanism (not shown).

In accordance with the present invention, a power supply circuit or power pulse generator 1 comprises a source of direct-current voltage 100 of an adjustable amplitude and a power switch 101, here shown constituted by a bank of power transistors each having main electrode terminals connected between dc source 100 and deposition interface constituted by electrode E and workpiece W and being sharply on/off controllable in a novel manner which will be described to deliver a series of controlled contact discharge pulses across the interface. The magnitude of the discharge current is here determined adjustably by the number of these power transistors each having as the emitter resistor of an identical resistance 101*r*. The polarity of the discharge power circuit usually is, as shown here, such that electrode E is poled positive and workpiece W is poled negative, but depending on a particular kind of deposition material with respect to a receiving workpiece material, the opposite polarity arrangement may be employed. Across power-switch bank 101, there is provided a shunt resistor 102 of a high ohmic value which thus directly connects dc source 100 with electrode E and workpiece W but serves to restrict the current drain from source 100 into the interfacial gap, when power transistors 101 are non-conducting, thereby providing an appropriate source of gap information signal during the pre-pulse or post-pulse stage of each discharge cycle, as will be apparent.

Control pulse generator for power switch 101 comprises a power supply 103, a Schmitt trigger circuit 104 having an input terminal *a*, a pair of intermediate terminals *b* and *c* and an output terminal *d*, and an output transistor 105 at which output signals of the Schmitt trigger develop to drive, via a first and second amplifier stages 106 and 107, power switch 101 into conduction and non-conduction. The input terminal *a* of Schmitt trigger is connected at a common point 108 firstly with a resistor 109 connected with line 110 which is in turn connected with the positive terminal of power supply 103 via a voltage-drop resistor 111, secondly with one terminal of a selected of capacitors 112 whose other terminal is connected with line 113 connected with the negative terminal of power supply 103 and also with electrode E, and thirdly via resistor 114 with line 115 connected with workpiece W. In this arrangement, resistor 109 and capacitor 112 form time-determining elements, the capacitor 112 being variably settable to fix or substantially fix the duration of each of current pulses passed through the interfacial gap E, W by switching action of power switch 101 effected through sharp control signals generated at transistor 105, amplified at transistors 106, 107 and delivered to the control electrodes of power switch 101. Connected in series with base resistor of power switch 101 between base terminal and line 113 is a bias voltage source 116 which is effective to sharply turn power transistors 101 into non-conduction, hence cutting off each power pulse instantaneously when "on" signal disappears at output signal transistor 105, hence at amplifier 106 and 107.

Figure 4:
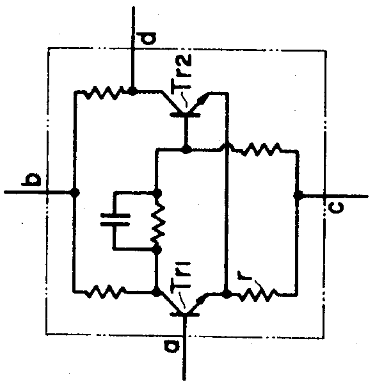
FIG. 4 is a circuit diagram showing the structure of Schmitt triggers used in the embodiments of FIGS. 1 to 3.

Specific details in structure of Schmitt trigger 104 employed in the present embodiment are shown in FIG. 4, it being noted that such structure is applicable to all of the other Schmitt triggers described in the present disclosure and diagrammatically shown with specified positions of four terminals. As is conventional, the Schmitt trigger here comprises two conjugate transistors in "on" and "off" states and is a bistable circuit in that it has one of its possible two states depending on its input level. Thus, when an input voltage applied to a first transistor T*r*1 across terminals *a* and *c* is lower than a threshold value settable by the magnitude of resistor *r*, the first transistor is nonconductive while a second transistor T*r*2 is conductive, thereby holding its emitter voltage level or output terminal *d* at a minimum voltage level. When, however, the threshold level is traversed by an increasing input level, first transistor T*r*1 is turned to "on" and second transistor is turned to "off" thereby elevating the voltage level at output terminal *d* to a maximum. This state is reversed when the input voltage drops to a second threshold level which is lower than the first.

Turning back to FIG. 1 resistor 114 is designed to have an ohmic value much higher than that of resistor 109 for reason which will be apparent. With this and the afore-mentioned mode of operation of Schmitt trigger 104 taken into consideration, let it be assumed that power switch 101 is now in the state of "on" and contact discharge is sustained across the interfacial gap between electrode E and workpiece W. In this state, capacitor 112 is charged via resistor 109 by voltage drop across lines 110 and 113 as derived from source 103 in a sense to make the input terminal *a* of Schmitt trigger 104 poled positive and line 113 negative, providing a ramp voltage across terminals *a* and *c* of the Schmitt trigger. In this state, gap impedance and voltage is of a reduced value, and lines 113 and 115 may thus be considered to be short-circuit but because of a high ohmic value of shunt resistor 114, such charging operation is not disturbed, and the input voltage across terminals *a* and *c* will continue to build up at a rate determined by capacitance of capacitor 112 and resistance of resistor 109 until it reaches a first threshold level setted to Schmitt trigger 104. When this latter condition is attained, phase reversal occurs in Schmitt trigger circuit 104 such that output transistor 105 which has been "on" is turned to "off" and, as a consequence, amplifier transistor 106 and 107 and power transistors 101 are turned to "off" to instantaneously terminate contact discharge having passed through the interfacial gap between electrode E and workpiece W.

As the discharge, upon cut-off of power switch 101, is quenched and the interfacial gap assumes a proper condition for receiving a next contact discharge, impedance at the gap will build up and an increasing gap voltage as derived from power source 100 through a high ohmic resistor 102, built up across lines 113 and 115, is effective across terminals *c* and *a* via resistor 109 to reverse voltage upon capacitor 112 in a sense to make its side of line 113 positive and its side of point 108 negative. When this dropping input signal traverses a second threshold value applied to Schmitt trigger circuit 104 as representative of a preselected gap impedance value, hence, indicative of a preselected pre-pulse gap state, phase reversal will take place in the latter whereby output transistor 105 is turned to "on," thereby turning amplifier transistors 106 and 107 to "on" and permitting power transistors 101 to turn "on" when a breakdown occurs at the interface of electrode E and workpiece W upon or after this phase reversal of Schmitt circuit 104.

Upon initiation of the discharge, gap voltage instantaneously drops to a discharge level and lines 113 and 115 are in effect short-circuited. This permits capacitor 112 again to be charged via resistor 109 from line voltage across lines 110 and 113 and the terminal voltage of capacitor to increase, providing a positive ramp voltage across input terminals *a* and *c* of Schmitt trigger 104 with the rising slope determined by the time constant of this charging network as noted earlier. When this rising ramp voltage exceeds the first threshold lever of Schmitt trigger 104, the latter is again phase-reversed to turn output transistor 105 to "off," thereby switching power switch 101 off instantaneously through intermediate amplifying stages 106 and 107. Upon termination of the discharge as a result of cut-off power switch 101, the gap monitoring system which consists of gap terminals 113 and 115, resistor 114 and capacitor 112, again beings to monitor the post-discharge gap condition represented in terms of gap impedance. Now assume that the contact pressure urging the electrode against the workpiece becomes excessive. Then, upon cut-off of power switch 101, gap impedance will remain low and consequently the voltage at point 108 will remain high with capacitor 112 still fully charged positively to hold signal output transistor 105 and hence power switch transistor 101 in "off" states, thereby withholding the next power pulse from being applied across such inadequate-state or premature interface. In such condition, some short-circuit current may flow into the gap through resistor shunt path 102 from voltage source 100 but because of the high ohmic value of this shunt resistor, the short-circuit current is very small and does not affect workpiece W detrimentally as will be the case with a high amperage discharge current uncontrolledly delivered to such premature gap condition.

Turning now to the lower side of FIG. 1, there is shown an improved vibrator system 2 which can be used advantageously, where an electrode-vibration type spark deposition process is employed, in combination with an improved spark-deposition power pulse generator in accordance with the present invention. The vibration system includes a direct-current power supply 200, an electromagnetic coil and a switching transistor 202 of npn type connected in series, the latter being switch-controlled by an oscillator network 203 to intermittently energize electromagnetic coil 201. The electromagnetic coil here may form, together with a magnetizable body and an armature (not shown), a conventional electromagnet arrangement which is incorporated in an electrode assembly which may conveniently be a hand-holdable device, and is operable, every time this coil is energized, to drive electrode E against or away from workpiece W against a spring force biasing the electrode away from or against the workpiece.

The base circuit of switching transistor 202 has an amplifier transistor 204 of pnp type which is adapted to be rendered conductive and non-conductive, when a npn signal transistor 205 provided at the output side of oscillator network 203 is rendered conductive and non-conductive, to supply a pulsed switching signal to transistor 202. As shown, transistor 205 and 204 are energized by a line voltage across lines 206 and 207 led from a d.c. voltage supply 208.

Oscillator 203 which is shown energized by a line voltage across lines 209 and 207 from voltage supply 208, includes a pair of time-constant network provided with a set of resistor 210 and capacitor 211 and with a set of resistor 212 and capacitor 213, respectively and operatively coupled with first Schmitt trigger 214 and second Schmitt trigger 215, respectively. The output terminal *d* of first Schmitt trigger 214 is coupled with the base of npn transistor 216 whose emitter and collector terminals are connected in shunt across capacitor 213. The output terminal *d* of second Schmitt trigger 215 is connected with line 209 via resistor 217 across which are connected emitter and base terminals of pnp transistor 218 and the latter has collector terminal led to line 207 via a pair of parallel resistor branches 219 and 220, one tied to base of transistor 211 connected in shunt across capacitor 211 and the other tied to the base of transistor 205. From these circuit connections, it will be seen that transistor 216 is rendered conductive when the first Schmitt trigger 214 has its input voltage exceeding its first reference level and is rendered non-conductive when this Schmitt trigger has its input voltage dropping below its second reference level which is lower than the first, whereas transistors 221 and 205 are rendered non-conductive when second Schmitt trigger 215 has its input voltage exceeding its first reference level and are rendered conductive when this Schmitt trigger has its input dropping below its second reference level.

In operation, let it be assumed that transistor 221 is now just cut off. This permits capacitor 211 to charge at a rate determined by its capacitance and the resistance of resistor 210, providing a ramp voltage at the input terminal *a* of Schmitt trigger 214. When this ramp voltage reaches the first reference level of Schmitt trigger 214, transistor 216 will be turn on as noted earlier and the charge stored on capacitor 213 will be dissipated through this transistor instantaneously. Then, since the input voltage to Schmitt trigger 215, traversing its second or lower reference level, drops to zero, transistor 218 will be turned on thereby turning output transistor 205 and feedback transistor 221 on. As a result of turn-on of transistor 221, charge stored on capacitor will then be dissipated through this transistor and the input voltage to first Schmitt trigger 214 will drop to zero, traversing its second or lower reference level, instantaneously. Consequently, transistor 216 will be turned off permitting capacitor 213 to charge at a rate determined by its capacitance and the resistance of resistor 212, providing a ramp voltage at the input terminal of second Schmitt trigger 215. When this ramp voltage reaches the first reference level of Schmitt trigger 215, transistor 218 will be turned off thereby turning off output transistor 215 also feedback transistor 221, and the system now returned to the original stage as mentioned earlier. It will be seen, therefore, that this system operates in a free-running mode which provides a succession of pulses for energization of coil 202 with the duration of the energization pulse determined by the capacitance of capacitor 213 and the resistance of resistor 212 in conjunction with the reference level of Schmitt trigger 215 and the pulse interval determined by the capacitance of capacitor 211 and the resistance of resistor 210 in conjunction with the reference level of Schmitt trigger 214. For convenience of adjustment of these vibration parameters and frequency, the reference levels of two Schmitt trigger 214 and 215 may be made equal and so may be resistance values of resistors 210 and 212 so that only the capacitors need be variably adjusted, or vice versa.

The vibrator system of FIG. 1 also incorporates a novel provision for terminating the electrode vibration when the contact pressure urging the electrode against the workpiece occasionally becomes excessive in the course of depositing operation, thereby permitting the operator to correctively readjust the contact pressure in such occasions. To this end, a npn transistor 231 is provided in parallel with transistor 221 in shunt across capacitor 211. Across lines 209 and 207 there are provided resistor 232 and capacitor 233 in series as shown and also a Schmitt trigger 234 with its input terminal *a* tied at point 236 between them and its output terminal *d* tied to the base of transistor 231 with base-emitter resistor. The input terminal *a* of Schmitt trigger 234 is also connected via resistor 235 to line 115 which leads to workpiece W while line 207 is connected to line 113 which leads to electrode E, these lines receiving, as noted above, gap information in terms of gap impedance which is representative of gap contact pressure. It should be noted here that resistor 235 has an ohmic value considerably higher than that of resistor 232. It should also be noted that when this vibrator system 2 is used in combination with discharge pulse generator 1, capacitor 333 preferably considerably higher in capacitance than capacitor 112 which is determinative of the duration of each of a series of discharge pulses so that the vibrator system, responds to the means value of gap impedance over several discharge pulse cycles.

In operation, it will be seen that when spark deposition proceeds under an adequate mean contact pressure, gap impedance across electrode E and workpiece W is high and as a result, the point 236 connecting resistor 232, resistor 235 and capacitor 333 together is drawn negatively. In this state, transistor 211 is held off so that oscillator 203 may operate in a free-running mode as described previously. When, however, contact pressure between electrode E and workpiece W becomes excessive, there will be drop in gap impedance value and lines 113 and 115 are brought into a short-circuit relationship. This permits the terminal voltage across capacitor 333 to build up positively and, when it exceeds a threshold reference established at Schmitt trigger 234, transistor 211 will be turned on thereby causing oscillator 203 to stop oscillating and, consequently, the electrode E to stop vibrating. Observing the electrode to stop vibration, the operator is thus able to optimize contact pressure between the electrode and the workpiece by drawing them away from each other to the extent that it is observed that the electrode begins again vibrating as a result of an increased impedance value at the gap which renders gap-signal transistor 231 nonconductive thereby enabling the oscillator 203 to oscillate.

Figure 2:
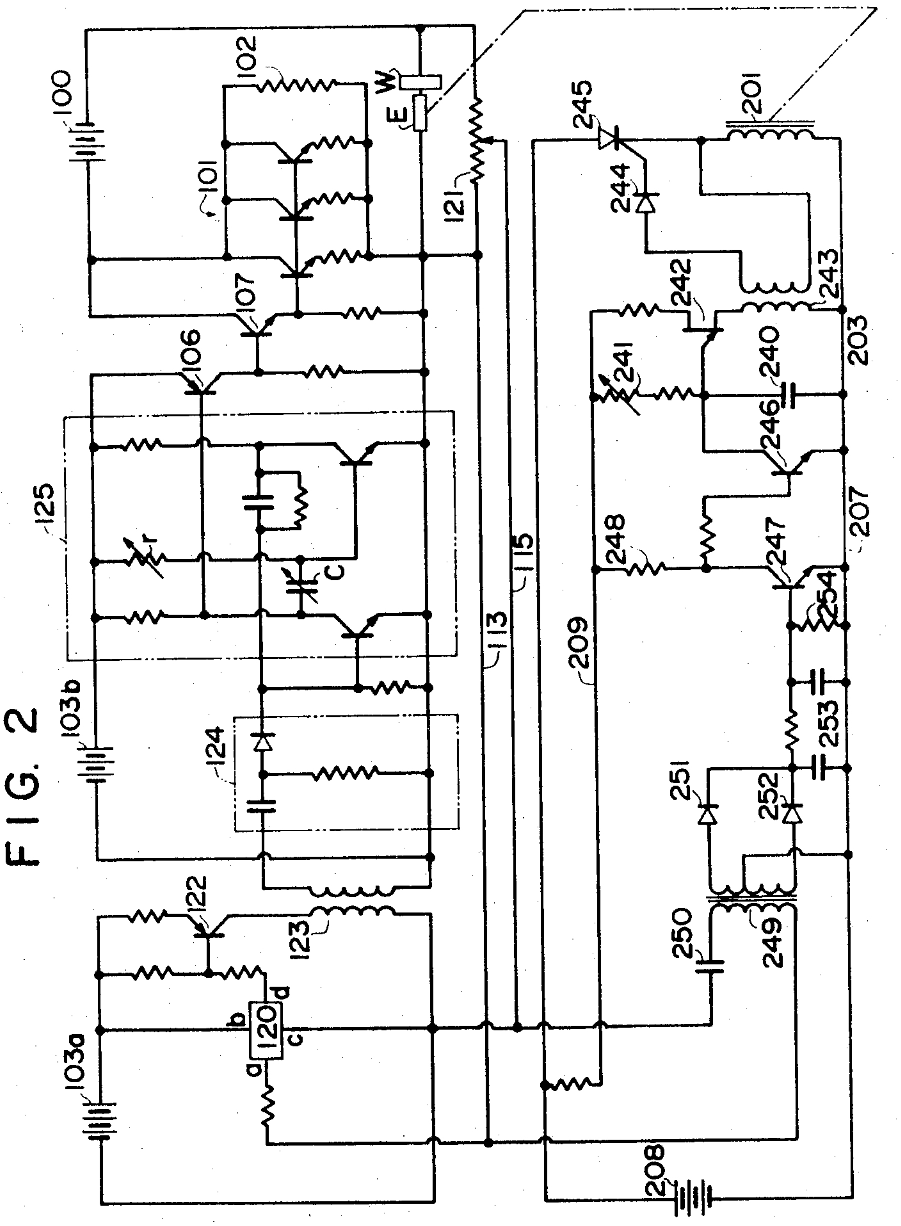
FIG. 2 is a circuit diagram showing another embodiment of the present invention including modified power supply circuit and electrode vibrating oscillator network.

Turning to FIG. 2 there is shown another embodiment of the present invention which includes again a power supply circuit 1 for pulsing the output of a power source 100 across the deposition interface with a power switch 101 to deliver a series of discharge power pulses controlled in response to the gap impedance and an oscillator network 2 for vibrating electrode E, the latter network here being dispensed with where the rotary or other non-vibration type of spark deposition is to be carried out. In this embodiment, the switching control network for power switch 101 comprises a gap-monitoring Schmitt trigger 120 whose input terminal *a* is connected via line 113 to the positive terminal of a gap sensing resistor 121 connected across electrode E and workpiece W while terminal *b* is connected via line 115 to the potentiometer tap, constituting a variable negative terminal, of gap resistor 121. The Schmitt trigger is energized by a supply 103*a* and its output terminal *d* is coupled with the base of pnp transistor 122 whose emitter and collector terminals are connected with the primary winding of a transformer 123 in series with supply 103*a*. The secondary winding of transformer 123 is coupled with a differentiator 124 whose output is in turn coupled with a monostable multivibrator 125 energizable by aupply 103*b*. Monostable multivibrator 125 has resistor *r* and capacitor *c*, either or both of which may be variable to adjustably determine the duration of the output pulse of monostable vibrator 125 which develops through pnp transistor 106. This transistor is coupled with the base of an amplifier transistor 107 which in turn is operatively coupled with the bases of power transistors 101 such that the latter is turned on for the duration of the control pulse passing through transistor 106, thus determined by resistor *r* and capacitor *c* of monostable multivibrator 125.

This arrangement is designed such that when the gap impedance after attaining a first threshold level drops to a second, transformer 123 and differentiator 124 operate to actuate monostable multivibrator 125 to produce a control output pulse which for its duration turns on power switch 101, the gap impedance being detected at gap resistor 121 as a corresponding voltage signal for comparison with the first and second threshold levels which are established at Schmitt trigger 220. Now assume that the gap impedance is above the first threshold value, indicating that the deposition interface is in an open gap condition or has accomplished recovery from the termination of the preceding power discharge. In this condition, transistor 122 is off because of an increased signal voltage appearing at the input of Schmitt trigger 220. Following this condition, when the gap impedance drops to the second threshold representative of a preselected power-discharge receivable gap condition, transistor 122 will turn on, this turn-on signal triggering monostable multivibrator into operation through transformer 123 and differentiator 124. In other words, after the termination of each power discharge, no succeeding power discharge occurs unless and until the deposition interface experiences two threshold conditions. It follows that when, for example, the contact pressure becomes excessive resulting in an undue drop of gap impedance value, no power switching takes place by power switch 101 until the contact pressure is corrected to have the deposition interface experience the first threshold condition. No trigger signal for power switch 101 is produced also where and as long as the deposition interface is open-circuited as a result of removal of electrode E from workpiece W, thus until the deposition interface experiences the second threshold condition.

Oscillator network 203 for vibrating electrode E comprises a relaxation oscillator having a capacitor 240 which is chargable via a variable resistor 241 by line voltage across lines 209 and 207 drawn from supply 208. The junction of these resistor and capacitor is connected to the emitter of a unijunction transistor 242 whose output terminal is connected to the primary winding of an output transformer 243, the primary winding being returned to capacitor 240. The output winding of transformer 243 is connected in series with a rectifier 244 across the gate-cathode terminals of a thyrister 245 whose anode and cathode are connected to the supply 208 in series with coil 201 which constitutes electromagnetic coil for vibrating electrode E. Capacitor 240 is shunted by the emitter-collector network of transistor 246 whose base-emitter network is in turn shunted via base resistor by the emitter-collector network of transistor 247 which bridges across lines 209 and 207 via resistor 248. It will be understood that as long as transistor 247 is held conductive transistor 246 is held conductive and, consequently, the relaxation oscillator will oscillate to energize intermittently electromagnetic coil 201 at a frequency determined by resistor 241 and capacitor 240.

The base network of transistor 247 which functions as gap-information transistor as will be apparent, includes a transformer 249 whose primary winding is connected in series with capacitor 250 across lines 113 and 115. The secondary winding of this transformer has a pair of terminals connected via rectifiers 251 and 252, respectively, to one terminal of an integrating network 253 and has a center tap connected to the other terminal of the integrator 253, the latter being adapted to develop an integrating voltage at resistor 254 connected across the base-emitter terminals of transistor 247.

In this embodiment of electrode vibrator, transistor 247 and its associated input network 249 to 254 are provided to function to discriminate a normal deposition-interface condition both from a dead short-circuit condition and from an open gap condition, thereby permitting oscillator 203 to oscillate and, hence, electrode E to vibrate only when the contact pressure applied to urge the electrode against workpiece W is in an optimum range. The dead short-circuit conditions occurs when the contact pressure becomes excessive whereas the open gap condition occurs when the electrode is retracted from the workpiece. In both of these extreme conditions, the gap impedance detected across line 113 and 115 are in essence continuous and consequently the terminal voltage of integrator 253 in the absence of its input differentiated signals is held substantially at zero level. This holds transistor 247 nonconductive and in turn transistor 246 conductive, thus shunting capacitor 240 to interrupt the vibration of electrode E. When, however, spark deposition proceeds under an adequate contact pressure, impedance drop and rise signals accompanying each power discharge are detected by the differentiator constituted by capacitor 250 and transformer 249 and transmitted via rectifiers 251 and 252 to integrate 253 whose terminal voltage thus increased renders transistor 247 conductive and in turn transistor 246 nonconductive to permit capacitor 240 to charge and discharge for a continued vibrator of electrode E.

Figure 3:
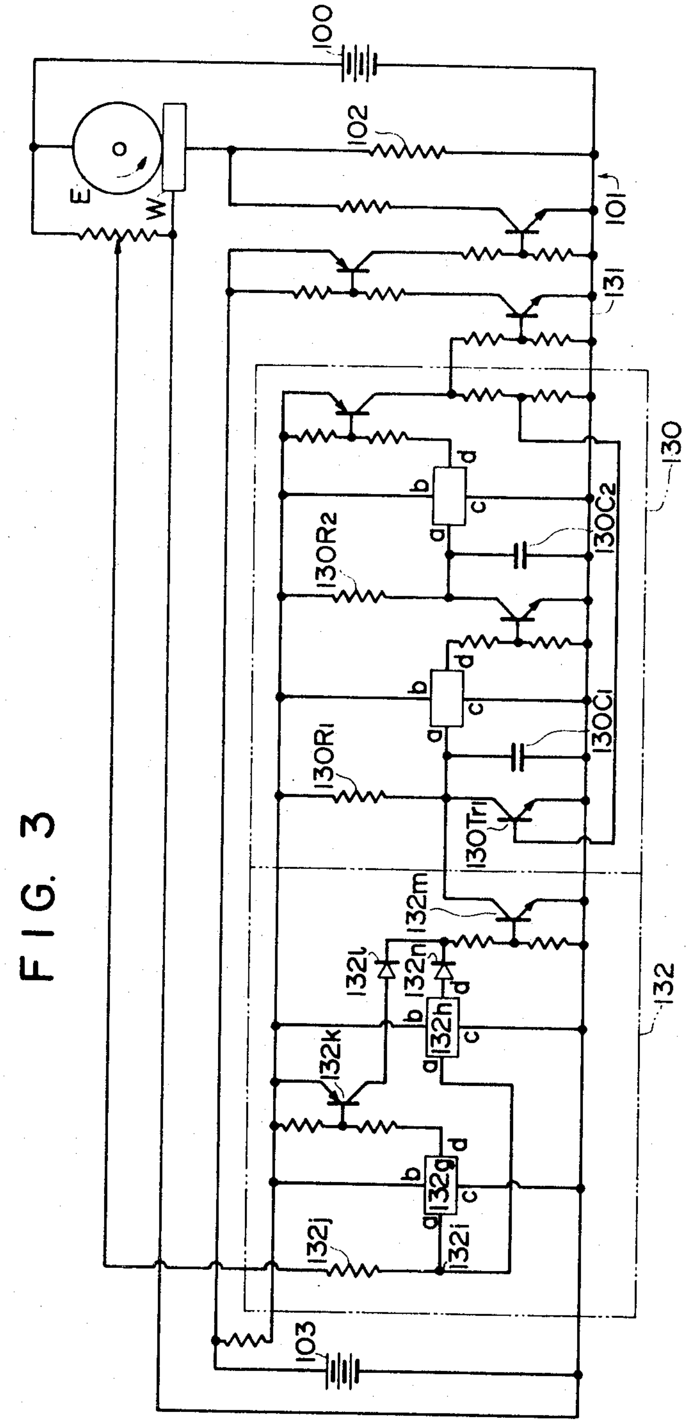
FIG. 3 is a circuit diagram showing still another embodiment of the present invention adapted for the electrode rotary type spark deposition or treatment method.

In FIG. 3 there is shown another form of gap-impedance responsive pulse generator according to the present invention and as used with a rotary type deposition process making use of a disk or cylindrical electrode E adapted to roll or rotate over workpiece W in sliding contact therewith. In this embodiment, it will be seen that the control pulser for switching operation of power switch 101 includes an oscillator 130 and an amplifier 131 at its output side which are identical to those used in the embodiment of FIG. 1 for providing vibration signals for electrode E. It will be understood that the time-constant network constituted by resistor 130R2 and capacitor 130C2 determines at a given value the pulse on-time of power switch 101 whereas the time-constant network constituted by resistor 130R1 and capacitor 130C1 determines pulse off-time while the deposition gap is in a normal impedance condition, or a minimum pulse off-time of power switch 101, as will be apparent. In order to make the mode of power-pulse generation self-adaptive to variable gap impedance conditions, this embodiment again includes a gap-information network which at the input side of oscillator 130 is designated at 132 which comprises a pair of impedance-discriminating threshold circuits constituted by a first Schmitt trigger **132*a* and a second Schmitt trigger 132*h*, respectively, and energizable by a supply 103 which energizes also oscillator 130 and amplifier 131**.

To respond to variable gap impedance upon and after the termination of each discrete power pulse, the input terminals *a* of Schmitt triggers **132*g* and 132*h*** are connected at point 132i which in turn leads via resistor 132*j* to the positive terminal of a variable resistor 121 provided across electrode E and workpiece W while their *c* terminals are commonly connected to the negative terminal of gap resistor 121. The output terminal *d* of first Schmitt trigger 132*g* is coupled with the base network of pnp transistor 132*k* whose collector terminal leads via diode 132*l* to the base of npn transistor 132*m*, whose emitter and collecter terminals are shunted across capacitor 130C1 in parallel with npn transistor 130Tr1 of oscillator 130, it being understood that the latter transistor is rendered conductive for the duration in which oscillator provides on-pulse signal for power switch 101 and rendered nonconductive when each on-pulse signal is cut off, by feed-back operation. The output terminal *d* of second Schmitt trigger 123*h* is connected via diode 132*n* to the base network of transistor 132*m*.

In this arrangement, first Schmitt trigger 132*g* is designed to establish a lower limit of a preselected gap impedance range for the initiation of a power pulse across electrode E and workpiece W whereas second Schmitt trigger 132*h* is designed to establish an upper limit of the preselected gap impedance range. When a deviation from the preselected range is experienced by either of these Schmitt triggers, transistor 132*m* is rendered conductive to provide a short-circuit path in shunt across capacitor 130C1 thereby interrupting the charging of the latter which would otherwise occur as a result of cut-off of transistor Tr1. It will be apparent that as long as this condition prevails, there is no subsequent pulse-on signal provided by oscillator 130 for power switch 101 and the latter remains off. Only when the gap impedance is detect-d by two threshold circuits 132*g* and 132*h* to be in the preselected range is capacitor 130C1 permitted to charge to a switching level for initiation of a signal pulse and, in turn, power discharge. It has been found that the optimum gap impedance range for preselection lies in the order of ohm-cm to the order of tens of ohm-cm in term of resistivity, the exact value depending on particular deposition and workpiece materials.

Thus, it will be seen that by virtue of gap-impedance responsive pulse control, disadvantages arising from a deviation of mechanical parameters are here again eliminated or obviated. Thus, by this provision, problems of possible thermal deterioration of the deposited surface, re-transfer of deposited material and abnormal consumption of electrode material due to abnormal current flow or discharge largely arising from excessive and/or difficient contact pressure are effectively eliminated and each of discrete power pulses is here strictly conditioned to achieve a preselected deposition performance against variation of mechanical parameters whereby it has been found that a highly uniform treated or coated layer with a deposit firmly diffusion-bonded with the workpiece substrate is obtained.

Figure 5:
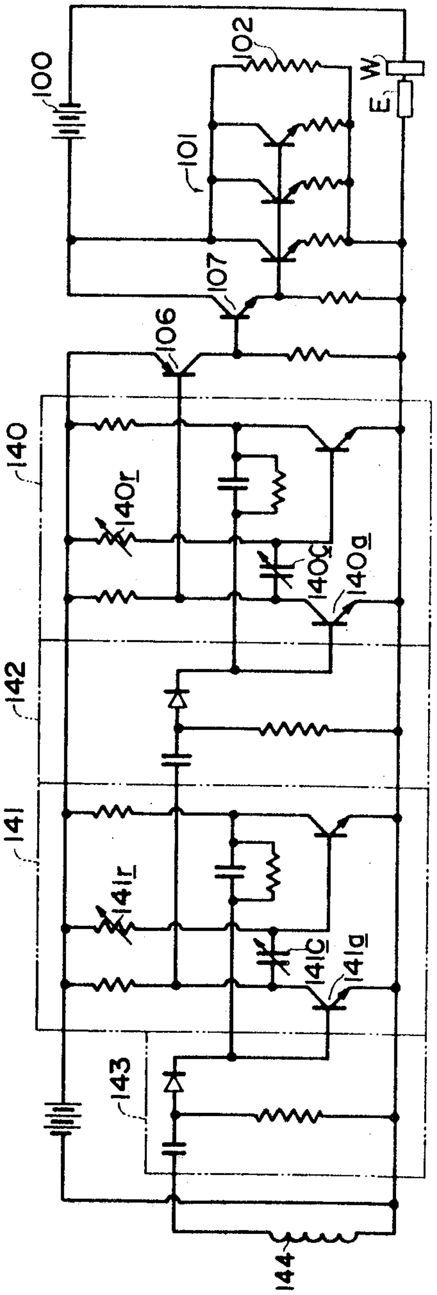
FIG. 5 is a circuit diagram showing a further embodiment of the present invention adapted for the electrode vibration type spark deposition or treatment method.

In FIG. 5 there is shown a still further embodiment of a gap-responsive power pulse generator of the present invention adapted for use for an electrode-vibration type spark deposition process, especially with an electrode vibrating oscillator 2 as shown in FIG. 2 which is omitted here. In this embodiment, power switch 101 is controlled by a pair of monostable multivibrators 140 and 141 connected in a tandem fashion as shown. Monostable multivibrator 141 has at its output side a differentiator 142 coupled with monostable multivibrator 140 and has at its input side a differentiator 143 coupled with a winding 144. This winding is here designed to form an additional secondary winding of transformer 243 used in FIG. 2 for providing electrode vibrating pulses for electrode coil 201. In this arrangement, the electrode vibration mechanism is adapted such that every time electrode coil 201 is energized by oscillation signal created by oscillator 203, electrode E is driven against workpiece W against spring force which in the absence of such signal retracts the electrode so that electrode contact drive and retraction alternately occurs at the output frequency of oscillator 203, the electrode contact drive commencing at the maximum distance of electrode E away from workpiece W.

Thus, it will be apparent that every time transformer 243 begins to be energized, winding 144 receives a signal indicating the maximum distance of electrode E away from workpiece W and the signal is differentiated by network 143 into a positive trigger pulse which in turn is applied to a normally nonconductive transistor * (* 141 *a* of first monostable multivibrator) 141 to render same conductive. The conducting period of transistor 141*a* is adjustably determined by the time-constant network constituted by resistor 141*r* and capacitor 141*c* either or both of which is variable. When, upon lapse of that period, this transistor is returned to nonconduction, a positive trigger signal is created by second differentiator 142 to trigger a normally nonconductive transistor 140*a* of second monostable multivibrator into conduction. With this transistor rendered conductive, power switch 101 coupled therewith via amplifier transistor 106 in the same operating phase is turned on. The conduction period of transistor 140*a* and in turn power switch 101 is adjustably determined by the time-constant network constituted by resistor 140*r* and capacitor 140*c* either or both of which is here again variable. Thus, it will be noted that the conduction period of transistor 141*a* fixes the duration in which electrode E approaches workpiece W preselected distance toward workpiece from a maximum distance away therefrom and the conduction period of transistor 140*a* fixes the duration of a power discharge which thenceforth is produced, these periods being here conveniently adjustably variable depending on particular kinds and combination of electrode and workpiece materials and performance result desired.

This embodiment, as well as previous embodiments as applied to an electrode-vibration type spark deposition or treatment, provides therefore a very close synchronization of each triggerable power discharge with each stroke of electrode vibration and here with the initiation and termination of each discharge controlled in conjunction with positions of the electrode as desired. It will be recalled that the improved electrode vibration system with which this power supply operates permits the electrode to vibrate only when the contact pressure and more generally gap impedance is in an optimum range. It follows, therefore, that in the case of any departure of these important parameters from a preselected range there is no switched pulse across the electrode and the workpiece, avoiding here again disadvantages of prior-art systems as mentioned previously.

What is claimed is:

1. In a method of discharge-treating a surface of an electrically conductive workpiece by bringing said surface and an electrode together to form a localized contact therebetween, iteratively effecting a spark discharge across a gap between said electrode and said surface to form a weld at the contact area upon said surface, breaking said contact to permit said weld to cool thereby leaving a metallurgic ally modified area upon said surface and sweeping said electrode over said surface to successively form such metallurgically modified areas over said surface, the improvement which comprises the steps of connecting a power supply with said electrode and said workpiece through an on/off controllable electronic switch, positively triggering said electronic switch independently of a breakdown at the gap for iteratively passing a spark discharge as a sharply defined power pulse through said gap, deriving from said gap a signal indicative of gap impedance variable as a function of gap state and controlling the switching operation of said electronic switch at least in part by said signal.

2. The method defined in claim 1 wherein said electrode is a rotary member adapted to rotate over said surface in sliding contact therewith, and said electronic switch is turned on periodically by an electronic oscillator, said method further comprising the step of interrupting the operation of said oscillator upon said signal shifting from a preselected range of gap impedance.

3. In a method of discharge-treating a surface of an electrically conductive workpiece by bringing said surface and an electrode together to form a localized contact therebetween, iteratively effecting a spark discharge across a gap between said electrode and said surface to form a weld at the contact area upon said surface, breaking said contact to permit said weld to cool thereby leaving a metallurgically modified area upon said surface and sweeping said electrode over said surface to successively form such metallurgically modified areas over said surface, the improvement which comprises the steps of:

connecting a power supply with said electrode and said workpiece through an on/off controllable electronic switch for iteratively passing a spark discharge as a sharply defined power pulse through said gap;

deriving from said gap a signal indicative of gap impedance variable as a function of gap state; and controlling the switching operation of said electronic switch at least in part by said signal, said signal being derived from said gap following the cut-off of a preceding power pulse to monitor the gap state, and said electronic switch being turned on upon ascertaining said signal in a preselected range of gap impedance to provide a next power pulse of a substantially fixed duration between said electrode and said workpiece.

4. The method as defined in claim 3 wherein said electrode is composed of a material fusible by said spark discharge and is vibrated to make and break intermittent localized contact with said surface to leave said material fused to said surface, said method further comprising the step of interrupting the vibration of said electrode upon said signal shifting from a preselected range of gap impedance.

5. In a method of discharge-treating a surface of an electrically conductive workpiece by bringing said surface and an electrode together to form a localized contact therebetween, iteratively effecting a spark discharge across a gap between said electrode and said surface to form a weld at the contact area upon said surface, breaking said contact to permit said weld to cool thereby leaving a metallurgically modified area upon said surface and sweeping said electrode over said surface to successively form such metallurgically modified areas over said surface, the improvement which comprises the steps of:

connecting a power supply with said electrode and said workpiece through an on/off controllable electronic switch for iteratively passing a spark discharge as a sharply defined power pulse through said gap;

deriving from said gap a signal indicative of gap impedance variable as a function of gap state; and controlling the switching operation of said electronic switch at least in part by said signal, said electronic switch being permitted to turn on upon said signal attaining a threshold level indicative of a preselected extent of gap impedance recovery after termination of the preceding pulse.

6. In a method of discharge-treating a surface of an electrically conductive workpiece by bringing said surface and an electrode together to form a localized contact therebetween, iteratively effecting a spark discharge across a gap between said electrode and said surface to form a weld at the contact area upon said surface, breaking said contact to permit said weld to cool thereby leaving a metallurgically modified area upon said surface and sweeping said electrode over said surface to successively form such metallurgically modified areas over said surface, the improvement which comprises the steps of:

connecting a power supply with said electrode and said workpiece through an on/off controllable electronic switch for iteratively passing a spark discharge as a sharply defined power pulse through said gap;

deriving from said gap a signal indicative of gap impedance variable as a function of gap state; and controlling the switching operation of said electronic switch at least in part by said signal, said electronic switch being turned on upon said signal, after traversing a first threshold level indicative of gap impedance recovery to a preselected value after termination of the preceding pulse, attaining a second threshold level indicative of a preselected discharge-triggerable gap impedance.

7. In a method of discharge-treating a surface of an electrically conductive workpiece by bringing said surface and an electrode together to form a localized contact therebetween, iteratively effecting a spark discharge across a gap between said electrode and said surface to form a weld at the contact area upon said surface, breaking said contact to permit said weld to cool thereby leaving a metallurgically modified area upon said surface and sweeping said electrode over said surface to successively form such metallurgically modified areas over said surface, the improvement which comprises the steps of:

connecting a power supply with said electrode and said workpiece through an on/off controllable electronic switch for iteratively passing a spark discharge as a sharply defined power pulse through said gap;

deriving from said gap a signal indicative of gap impedance variable as a function of gap state;

controlling the switching operation of said electronic switch at least in part by said signal, said electrode being composed of a material fusible by said spark discharge and being vibrated to make and break intermittent localized contact with said surface to leave said material fused to said surface;

interrupting the vibration of said electrode upon said signal shifting from a preselected range of gap impedance,, said electronic switch being turned on after a preselected delay interval from the time at which said electrode is driven toward said surface in the course of each stroke of vibration to thenceforth provide a power pulse of a substantially fixed duration.

8. An apparatus for discharge-treating a surface of an electrically conductive workpiece by bringing said surface and an electrode together to form a localized contact therebetween, iteratively effecting a spark discharge across an interfacial gap between said electrode and said surface to form a weld at the contact area upon said surface, breaking said contact to permit said weld to cool thereby leaving a metallurgically modified area upon said surface and sweeping said electrode over said surface to successively form such metallurgically modified areas over said surface, said apparatus comprising a power source, an electronic switch operatively connected between said source and said interfacial gap, means for positively triggering said electronic switch into a conductive state independently of breakdown at said gap for providing iteratively a spark discharge as a sharply defined power pulse across said interfacial gap and a pulser operable in response to a signal derived from said interfacial gap indicative of gap impedance to provide a switching signal for said electronic switch.

9. An apparatus for discharge-treating a surface of an electrically conductive workpiece by bringing said surface and an electrode together to form a localized contact therebetween, iteratively effecting a spark discharge across an interfacial gap between said electrode and said surface to form a weld at the contact area upon said surface, breaking said contact to permit said weld to cool thereby leaving a metallurgically modified area upon said surface and sweeping said electrode over said surface to successively form such metallurgically modified areas over said surface, said apparatus comprising:

a power source;

an electronic switch operatively connected between said source and said interfacial gap for providing iteratively a spark discharge as a sharply defined power pulse across said interfacial gap and a pulser operable in response to a signal derived from said interfacial gap indicative of gap impedance to provide a switching signal for said electronic switch, said pulser including:

sensing means connected with said electrode and said workpiece for receiving said signal following the cut-off of preceding power pulse;

threshold means for discriminating said signal with respect to at least one threshold value and operable upon said signal attaining said threshold value to provide said switching signal for initiation of a next power pulse; and time-determining means for fixing the duration of the power pulse substantially at a constant value.

10. The apparatus as defined in claim 9, further comprising electromagnetic means energizable by an oscillator circuit for vibrating said electrode to make an intermittent contact with said surface; and means responsive to said signal for interrupting the oscillation of said circuit upon deviation of said signal from a preselected impedance range.

11. The apparatus defined in claim 10 wherein said pulser is coupled with the output of said oscillator for providing said switching pulse in synchronism with the output signal of said oscillator circuit.

12. An apparatus for the fusion of material to a conductive workpiece substrate, comprising an electrode juxtaposable with a surface of said workpiece substrate to form an interface therewith;

means for displacing said electrode relative to said substrate to form successive contact interfaces over said surface of said surface of said substrate;

a source of electrical pulses including a triggerable switch connected across said workpiece and said electrode for generating fusion discharges at said interfaces; and circuit means including means for continually triggering said switch independently of a breakdown at said interface and means responsive to the impedance of said interfaces for controlling said source to permit pulsing at the interfaces upon said impedance being within a predetermined range.

13. An apparatus for the fusion of material to a conductive workpiece substrate, comprising :

an electrode juxtaposable with a surface of said workpiece substrate to form an interface therewith;

means for displacing said electrode relative to said substrate to form successive contact interfaces over said surface of said substrate;

a source of electrical pulses connected across said workpieces and said electrode for generating fusion discharges at said interfaces;

circuit means responsive to the impedance of said interfaces for controlling said source to permit pulsing at the interfaces upon said impedance being within a predetermined range, said source including an electric-current supply, and a plurality of parallel-connected transistors collectively connected in series with said supply, said substrate and said electrode, said circuit means including a SCHMITT-trigger network having a first threshhold and a second threshold defining said range, means connecting said SCHMITT-trigger network to the interfaces formed by said electrode and said substrate, and means connecting said SCHMITT-trigger network to the bases of said transistors for controlling same.

14. The apparatus defined in claim 13, further comprising a current-limiting low-drain resistor connected in shunt across said transistors and in series with said supply, said electrode and said substrate.

15. The apparatus defined in claim 13 wherein said SCHMITT-trigger network includes variable impedance means for setting at least one of said thresholds.

16. The apparatus defined in claim 13 wherein said means for displacing said electrode relative to said workpiece comprises an electromagnetic coil, an oscillator in circuit with said electromagnetic coil and means connecting said SCHMITT-trigger network to said oscillator for controlling the displacement of said electrode relative to said substrate in accordance with interfacial impedance.

17. The apparatus defined in claim 13, further comprising a time-constant network connected in circuit with said SCHMITT-trigger network for regulating the conduction time of said transistors.

18. An apparatus for the fusion of material to a conductive workpiece substrate, comprising:

an electrode juxtaposable with a surface of said substrate to form an interface therewith;

means for displacing said electrode relative to said substrate to form successive contact interfaces over said surface of said substrate;

a source of electrical pulses connected across said workpiece and said electrode for generating fusion discharges at said interfaces;

circuit means responsive to the impedance of said interfaces for controlling said source to permit pulsing at the interfaces upon said impedance being within a predetermined range, said source including an electric-current supply, and a plurality of parallel-connected transistors collectively connected in series with said supply, said substrate and said electrode, said circuit means including a pair of tandem-connected monostable multivibrators connected to said transistors for energizing same; and a differentiation network connected between said monostable multivibrators, the output of one of said multivibrators being applied to said transistors, the output of the other monostable multivibrator being applied via said differentiation network and therethrough to the input of the first-mentioned monostable multivibrator, said means for displacing said electrode relative to said substrate including an oscillator coupled to the second monostable multivibrator.

19. The apparatus defined in claim 18 wherein said means for displacing said electrode relative to said workpiece includes an oscillator, electromagnetic coil means connected with said electrode for vibrating same and a winding inductively coupled to said coil means and connected to said second monostable multivibrator.

20. The apparatus defined in claim 19, further comprising a second differentiation network connected between said winding and said second monostable multivibrator.

21. An apparatus for the fusion of material to a conductive substrate comprising:

an electrode rotatable in sliding engagement with the surface of said substrate;

means for rotating said electrode in contact with said workpiece substrate;

a source of electric current a triggerable electronic switch connected between said source, said workpiece and said electrode for supplying sharp-wavefront electrical pulses through said workpiece and said electrode for generating fusion discharges in succession over said surface between said electrode and said workpiece;

an oscillator connected with said switch for periodically triggering same; and means for interrupting the operation of said oscillator in response to the impedance across said electrode and said workpiece to permit triggering of said switch upon said impedance being within a predetermined range.

* * * * *